US012739969B2

(12) United States Patent
Peng et al.

(10) Patent No.: US 12,739,969 B2
(45) Date of Patent: Sep. 15, 2026

(54) COLLAPSE-FREE CIRCUIT STRUCTURE WITH LOW CAPACITANCE EFFECT

(71) Applicant: UNIMICRON TECHNOLOGY CORP., Taoyuan City (TW)

(72) Inventors: Chia-Yu Peng, Taoyuan City (TW); Kai-Ming Yang, Taoyuan City (TW); Pu-Ju Lin, Taoyuan City (TW); Cheng-Ta Ko, Taoyuan City (TW)

(73) Assignee: UNIMICRON TECHNOLOGY CORP., Taoyuan City (TW)

( * ) Notice: Subject to any disclaimer, the term of this patent is extended or adjusted under 35 U.S.C. 154(b) by 208 days.

(21) Appl. No.: 18/662,236

(22) Filed: May 13, 2024

(65) Prior Publication Data

US 2025/0331101 A1 Oct. 23, 2025

(30) Foreign Application Priority Data

Apr. 19, 2024 (TW) ................................ 113114693

(51) Int. Cl.
*H05K 1/02* (2006.01)
*H05K 1/11* (2006.01)

(52) U.S. Cl.
CPC ......... *H05K 1/0251* (2013.01); *H05K 1/0225* (2013.01); *H05K 1/024* (2013.01); *H05K 1/0245* (2013.01); *H05K 1/025* (2013.01); *H05K 1/0219* (2013.01); *H05K 1/116* (2013.01); *H05K 2201/2009* (2013.01)

(58) Field of Classification Search
CPC .... H05K 1/0251; H05K 1/024; H05K 1/0245; H05K 2201/2009; H05K 1/0225; H05K 1/025; H05K 1/0224; H05K 1/0219; H05K 1/116; H05K 2201/09718; H05K 2201/09727; H05K 2201/043;
(Continued)

(56) References Cited

U.S. PATENT DOCUMENTS

| | | | | |
|---|---|---|---|---|
| 6,400,234 B1 * | 6/2002 | Ohhashi | ............... | H01R 12/523 333/260 |
| 2005/0104191 A1 * | 5/2005 | Jow | ........................ | H05K 1/162 257/659 |

(Continued)

FOREIGN PATENT DOCUMENTS

| | | |
|---|---|---|
| CN | 103442513 A | 12/2013 |
| CN | 110996499 A | 4/2020 |

*Primary Examiner* — Steven T Sawyer
(74) *Attorney, Agent, or Firm* — WPAT, PC

(57) ABSTRACT

A collapse-free circuit structure with low capacitance effect includes a circuit layer that is layered between a connection layer and a bottom circuit layer. A pad and an upper circuit of the connection layer are spaced with an upper gap for electrical insulation. The bottom circuit layer includes a bottom circuit and a pad supporting structure, wherein the pad supporting structure is located right below the pad. The pad supporting structure and the bottom circuit are spaced with a bottom gap for electrical insulation. The circuit layer includes a circuit layer dielectric, wherein the circuit layer dielectric is located between the pad and the pad supporting structure. The existence of the upper gap and the bottom gap ensures low capacitance effect between the connection layer and the bottom circuit layer. The pad supporting structure prevents the pad from collapsing.

12 Claims, 12 Drawing Sheets

(58) Field of Classification Search
CPC ... H05K 2201/0347; H05K 2201/0959; H05K 2203/0242; H05K 2201/093
See application file for complete search history.

(56) References Cited

U.S. PATENT DOCUMENTS

| | | | | |
|---|---|---|---|---|
| 2005/0190614 | A1* | 9/2005 | Brunette .............. | H05K 1/0251 365/192 |
| 2009/0015345 | A1* | 1/2009 | Kushta ................. | H05K 1/0251 333/34 |
| 2012/0052700 | A1* | 3/2012 | Niitsu .................... | H05K 1/147 439/74 |
| 2014/0083756 | A1* | 3/2014 | Moeller ............... | H05K 1/0231 174/260 |
| 2021/0168935 | A1* | 6/2021 | Lin ........................ | H05K 1/113 |

* cited by examiner

201

205
202

206
204
206
204
203

COLLAPSE-FREE CIRCUIT STRUCTURE WITH LOW CAPACITANCE EFFECT

CROSS-REFERENCE TO RELATED APPLICATION(S)

This application claims the priority benefit of TW application serial No. 113114693 filed on Apr. 19 2024, the entirety of which is hereby incorporated by reference herein and made a part of the specification.

BACKGROUND OF THE INVENTION

1. Field of the Invention

The present invention relates to a circuit structure, more particularly a collapse-free circuit structure with low capacitance effect.

2. Description of the Related Art

In a technical field of a transmission line, a characteristic impedance of a transmission line is configured to affect a signal quality transmitted through the transmission line. More importantly, when a transmission line transmits or receives a current, a transmitted signal and a received signal through the transmission line will have a voltage difference due to a resistance of the transmission line. The characteristic impedance of the transmission line is thus of key importance to determine the voltage difference between the transmitted signal and the received signal of the transmission line.

In electrical engineering, the characteristic impedance of the transmission line is defined as the following formula:

$$Z_0 = \sqrt{(R + jwL)/(G + jwC)}$$

wherein $Z_0$ represents the characteristic impedance of the transmission line, R represents a resistance of a unit length of the transmission line, L represents an inductance of the unit length of the transmission line, C represents a capacitance of the unit length of the transmission line, G represents a conductance of a unit length of a dielectric material of the transmission line, j represents an imaginary unit, and w represents an angular frequency of a signal being transmitted by the transmission line.

In a technical field of high frequency signal transmission, w will have a value much higher than a value of R or a value of G. Assuming the transmission line is nearly ideal and lossless, the value of R and the value of G will both approach zero. As such, the aforementioned formula for the characteristic impedance of the transmission line may be simplified as:

$$Z_0 = \sqrt{(jwL)/(jwC)} = \sqrt{L/C}$$

wherein a direct correlation between $Z_0$ and C is evident.

According to maximum power transfer theorem, when a resistance of the transmission line and a resistance of a load that is electrically connected to the transmission line form a complex conjugate pair, i.e. when the resistance of the transmission line equals a complex conjugate of the resistance of the load, maximum power may be transferred between the transmission line and the load. For this reason, to ensure maximum power is transferred between the transmission line and the load, impedance matching between the transmission line and the load is critically important.

When the transmission line is first rolled out from a factory, the transmission line has a default capacitance that is often used for impedance matching with the load. However, when parasitic charges appear in the transmission line during transmission, a capacitance of the transmission line changes to be different from the default capacitance, and thus creating an impedance mismatch between the transmission line and the load. In other words, when the capacitance of the transmission line changes, the impedance mismatch between the transmission line and the load happens, and thus negatively affecting the signal quality of a signal that is being transmitted. For instance, a negatively affected signal may suffer from noises caused by the parasitic charges in the transmission line. This phenomenon is especially problematic in the technical field of high frequency signal transmission, and therefore, in the technical field of high frequency signal transmission, it is paramount to try to lessen or eliminate capacitance effect within the transmission line when transmitting signals.

With reference to FIG. 6A, an ordinary transmission line structure includes a ground circuit layer 101 that is formed on a substrate 100, a middle circuit layer 102 that is formed on the ground circuit layer 101, and a single-direction transmission line layer 103 that is formed on the middle circuit layer 102. The middle circuit layer 102 includes first dielectrics and a first circuit that is formed on the first dielectrics. The single-direction transmission line layer 103 includes second dielectrics and a second circuit that is formed on the second dielectrics. As such, the second circuit of the single-direction transmission line layer 103 and the first circuit of the middle circuit layer 102 are separated by dielectrics such as the second dielectrics, and thus forming two conductive plates for the capacitance effect to take place. In electrical engineering, a strength of the capacitance effect, or capacitance, is proportional to a surface area of the two conductive plates facing each other. Therefore, by lowering a surface area of any one of the conductive plates facing each other, the strength of the capacitance effect decreases.

With reference to FIG. 6B, in an example, for the ordinary transmission line structure to decrease a surface area of the ground circuit layer 101, an opening 104 is formed in the ground circuit layer 101. However, when the substrate 100 is a high density substrate, such as being a thin film or a redistribution layer (RDL), the formation of the opening 104 can easily cause structural collapse of the first circuit and the second circuit. In other words, the middle circuit layer 102 and the single-direction transmission line layer 103 that are formed above the opening 104 may partially cave in due to a lack of structural support, thus overall damaging the ordinary transmission line structure and destabilizing a transmission signal.

Furthermore, the collapsed circuits, i.e. the first circuit and the second circuit, also greatly increase the difficulty for the said circuits to be soldered. By having a wider diameter for the opening 104, despite allowing the strength of the capacitance effect to be weakened, the cave in collapse of the first circuit and the second circuit is worsened due to an increasing lack of structural support. For example, when the opening 104 has a diameter of a few tens of microns (μm), structural collapse is highly likely going to occur. For this reason, the solution of forming the opening 104 in the ground circuit layer 101 for decreasing the capacitance of the ordinary transmission line structure is largely impractical.

With reference to FIGS. 7A to 7C, in another example, an ordinary transmission line includes multiple circuit layers that are layered together. For example, a bottom ground circuit layer 201 is located at a bottom, a middle transmission circuit layer 202 is formed on top of the bottom ground circuit layer 201, and an external connection circuit layer 203 is formed on top of the middle transmission circuit layer 202. The external connection circuit layer 203 includes a plurality of pads 204 for transmitting a pair of differential signals, and the middle transmission circuit layer 202 includes a pair of transmission channels 205 to transmit the pair of differential signals.

With further reference to FIG. 7D and FIG. 8, if a position of the pads 204 in FIG. 7D is crossed by a line Z, a cross-sectional view is shown as FIG. 8. In FIG. 8, at least one opening 206 is formed between the pads 204. Although the at least one opening 206 is able to slightly decrease a strength of the capacitance effect between the bottom ground circuit layer 201 and the external connection circuit layer 203 that is occurring near the pads 204, this slight decrease of capacitance is of limited effect. This is because it is impractical for additional openings to be introduced to the bottom ground circuit layer 201 without causing the aforementioned structural collapse problems for the layers above the bottom ground circuit layer 201.

However, by having the at least one opening 206 between the pads 204, the ordinary transmission line greatly limits its available space for circuit designs. The reason being, as technology advances, pads utilized for transmitting high frequency signals, as a whole, is demanded to have more surface areas and volumes. In other words, when an overall surface area and volume of the pads 204 increases, the at least one opening 206 formed on the external connection circuit layer 203 will have less surface area and volume available. As a result, the strength of the capacitance effect, or the capacitance, near the pads 204 increases. For the above reasons, in the technical field of high frequency signal transmission, it is of great technical interest to further decrease the strength of the capacitance effect within a transmission line.

SUMMARY OF THE INVENTION

The present invention provides a collapse-free circuit structure with low capacitance effect. When the collapse-free circuit of the present invention is utilized for high frequency transmission applications, the collapse-free circuit is able to further decrease the strength of the capacitance effect in comparison to prior art, while preventing structural collapse of the circuit structure, and thus improving a signal quality of a high frequency signal that is being transmitted.

The collapse-free circuit structure with low capacitance effect of the present invention includes:

a connection layer, having a pad and an upper circuit; wherein the upper circuit surrounds the pad; the pad and the upper circuit of the connection layer are spaced with an upper gap for electrical insulation;

a bottom circuit layer, having a bottom circuit and a pad supporting structure, wherein the pad supporting structure is located right below the pad, and the bottom circuit surrounds the pad supporting structure; the pad supporting structure and the bottom circuit are spaced with a bottom gap for electrical insulation;

a circuit layer, having a circuit layer dielectric; wherein the bottom circuit layer, the circuit layer, and the connection layer are layered together, and the circuit layer is layered between the bottom circuit layer and the connection layer; wherein the circuit layer dielectric is located between the pad and the pad supporting structure.

The installment of the upper gap and the bottom gap helps to decrease a strength of a capacitance effect, or a capacitance, between the connection layer and the bottom circuit layer. Since the pad supporting structure is located right below the pad, the pad is structurally well supported and free from collapsing. In other words, the pad of the connection layer is able to be structurally supported by the circuit layer dielectric of the circuit layer and the pad supporting structure of the bottom circuit layer. Moreover, since the pad supporting structure is a structure that is electrically insulated, electrical charges within the pad supporting structure remain constant, which helps to prevent the capacitance effect from happening.

As such, the collapse-free circuit structure with low capacitance effect of the present invention is able to further decrease a capacitance between the connection layer and the bottom circuit layer in comparison from a known transmission circuit structure, and thus preventing impedance of the collapse-free circuit structure from changing when transmitting signals. In other words, when the collapse-free circuit structure of the present invention transmits a high frequency signal to a load, the collapse-free circuit structure and the load can maintain matched impedances, and thus improving a signal-to-noise ratio (SNR) of the high frequency signal being transmitted. On the other hand, since the connection layer and the circuit layer remain structurally stable and collapse-free, the present invention also ensures the high frequency signal being transmitted through the connection layer and the circuit layer remain stable. Such a structural stability also ensures that the connection layer is able to be normally soldered to other electrical components, such as a resistor, an inductor, or a capacitor, and thus improves the collapse-free circuit structure's compatibility to other circuits for more various electrical applications.

DETAILED DESCRIPTION OF THE INVENTION

The present invention provides a collapse-free circuit structure with low capacitance effect.

Figure 1C:
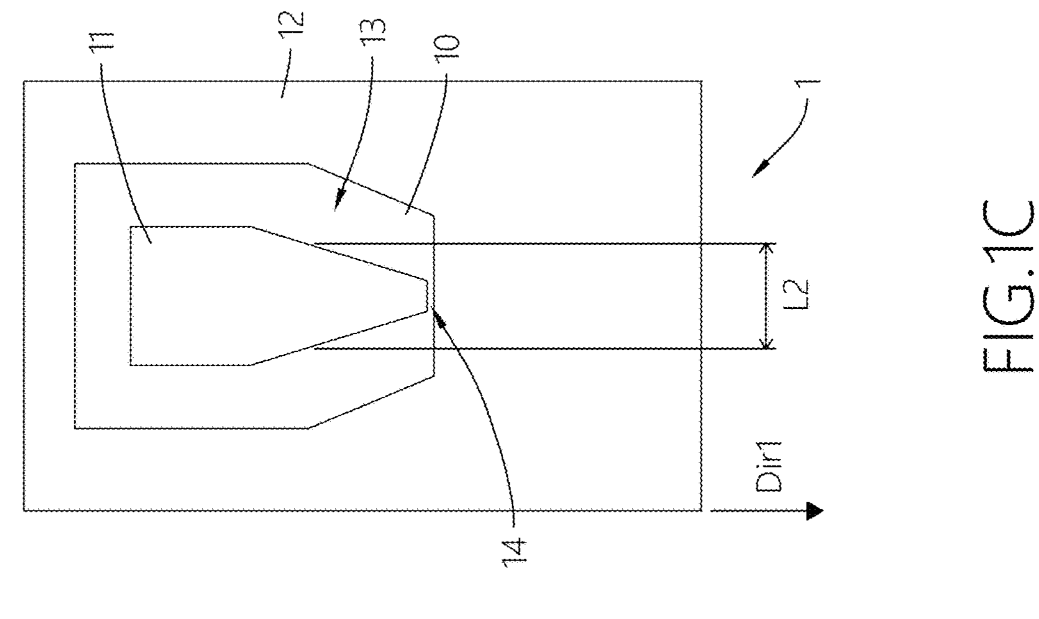
FIG. 1C is a perspective view of a bottom circuit layer of the collapse-free circuit structure in the first embodiment of the present invention.
Figure 1B:
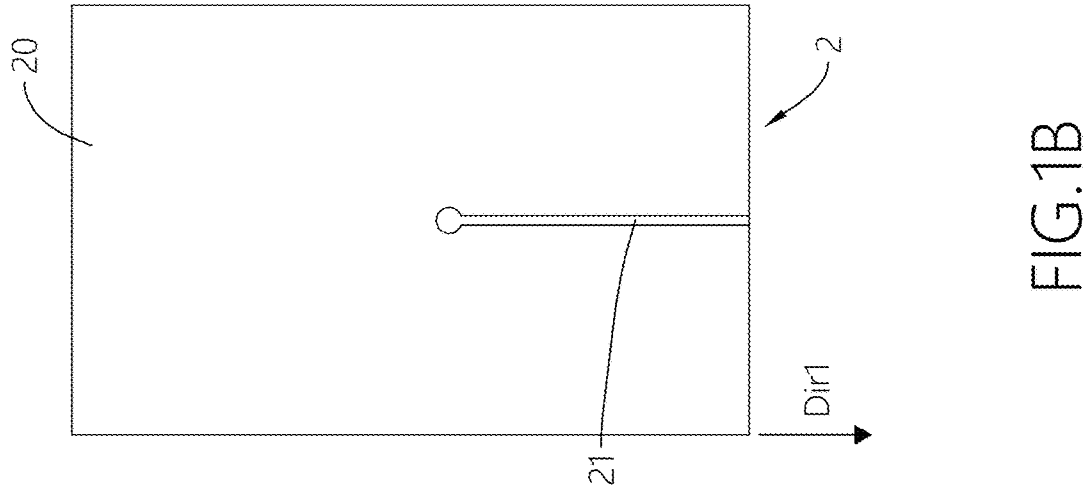
FIG. 1B is a perspective view of a circuit layer of the collapse-free circuit structure in the first embodiment of the present invention.
Figure 1A:
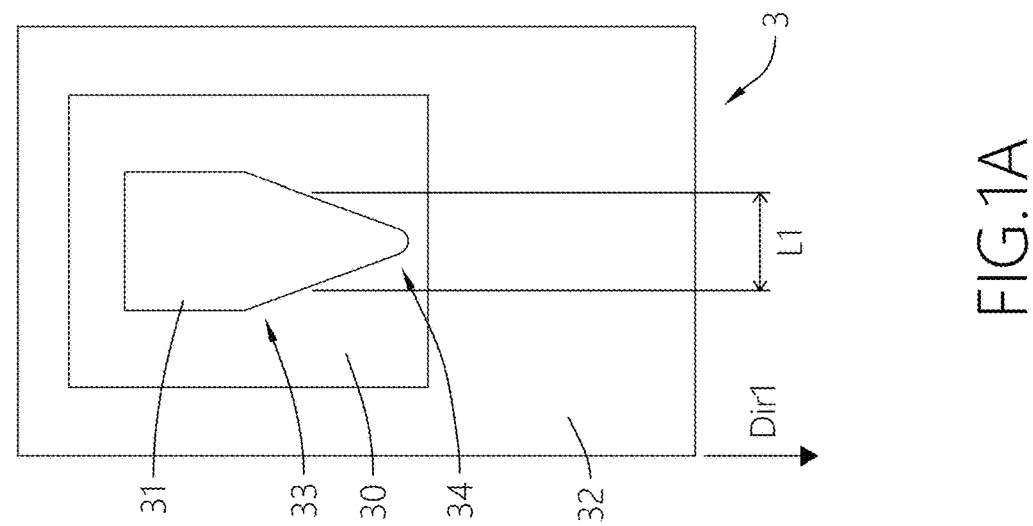
FIG. 1A is a perspective view of a connection layer of a collapse-free circuit structure with low capacitance effect in a first embodiment of the present invention.

With reference to FIGS. 1A to 1C, in a first embodiment of the present invention, the collapse-free circuit structure with low capacitance effect includes a bottom circuit layer 1, a circuit layer 2, and a connection layer 3.

The bottom circuit layer 1 includes a pad supporting structure 11 and a bottom circuit 12. The bottom circuit 12 surrounds the pad supporting structure 11. The pad supporting structure 11 and the bottom circuit 12 are spaced with a bottom gap 13 for electrical insulation. The circuit layer 2 includes a circuit layer dielectric 20. The connection layer 3 includes a pad 31 and an upper circuit 32. The upper circuit 32 surrounds the pad 31. The pad 31 and the upper circuit 32 are spaced with an upper gap 33 for electrical insulation.

Figure 1D:
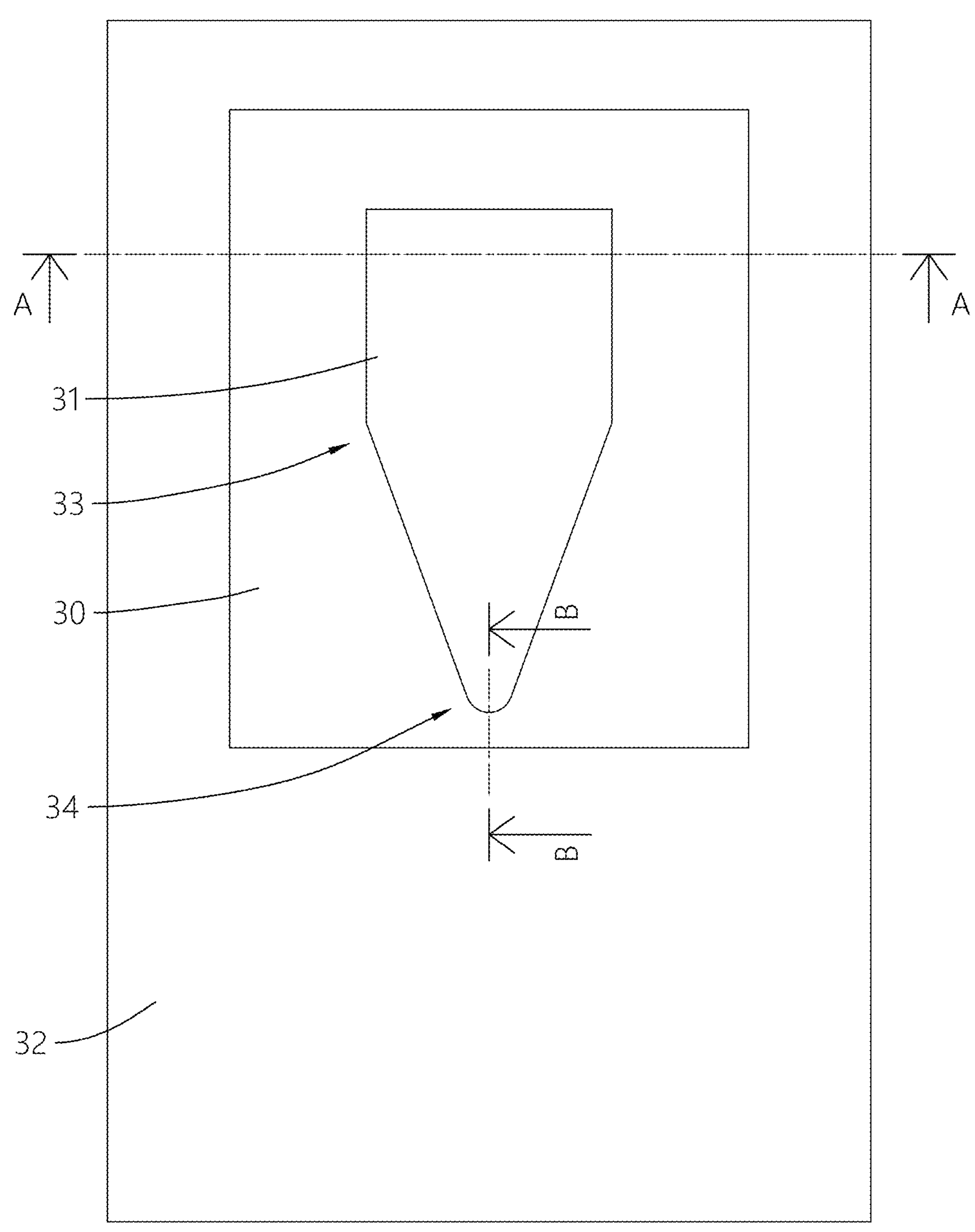
FIG. 1D is a perspective view of the collapse-free circuit structure in the first embodiment of the present invention.
Figure 2A:
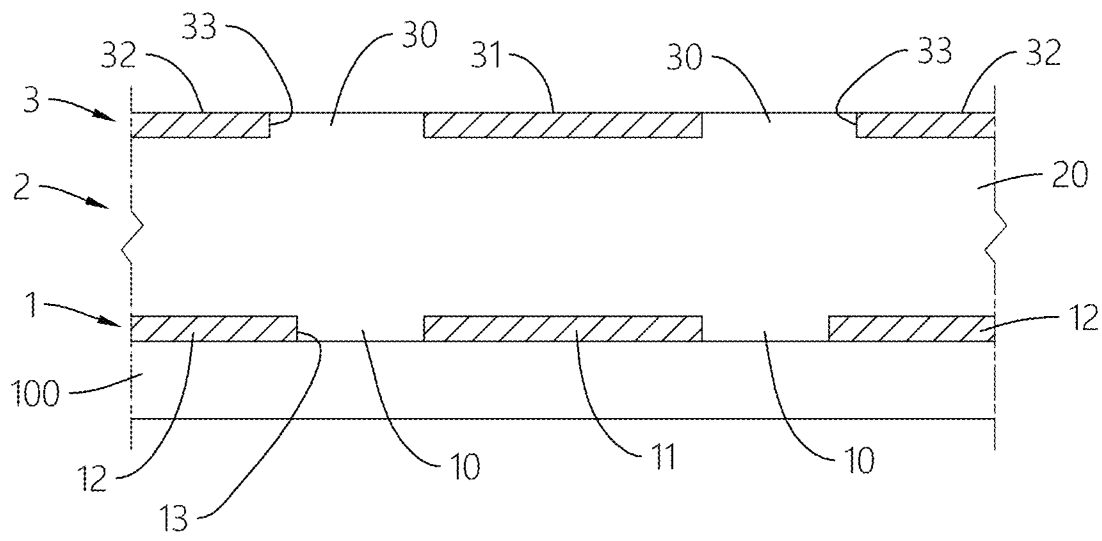
FIG. 2A is a cross-sectional perspective view of the collapse-free circuit structure in the first embodiment of the present invention.

With further reference to FIG. 1D and FIG. 2A, FIG. 1D shows a perspective view of the collapse-free circuit having the bottom circuit layer 1, the circuit layer 2, and the connection layer 3 shown in FIGS. 1A to 1C layered together. FIG. 2A shows a cross-sectional perspective view of the collapse-free circuit structure across a line A shown in FIG. 1D. As FIG. 2A shows, the circuit layer 2 is layered between the bottom circuit layer 1 and the connection layer 3. The circuit layer dielectric 20 of the circuit layer 2 is formed between the pad supporting structure 11 of the bottom circuit layer 1 and the pad 31 of the connection layer 3. In view of the bottom circuit layer 1 and the connection layer 3 that are layered together, the pad supporting structure 11 is located right below the pad 31.

As such, the installment of the bottom gap 13 and the upper gap 33 helps to decrease a strength of a capacitance effect, or a capacitance, between the bottom circuit layer 1 and the connection layer 3. Since the pad supporting structure 11 is located right below the pad 31, the pad 31 is structurally well supported and free from collapsing. In other words, the pad 31 of the connection layer 3 is able to be structurally supported by the circuit layer dielectric 20 of the circuit layer 2 and the pad supporting structure 11 of the bottom circuit layer 1. Moreover, since the pad supporting structure 11 is a structure that is electrically insulated, electrical charges within the pad supporting structure 11 remain constant, which helps to prevent the capacitance effect from happening. Overall, by structurally reducing the capacitance effect from taking place between the bottom circuit layer 1 and the connection layer 3, the collapse-free circuit structure with low capacitance effect of the present invention is able to prevent an impedance of the collapse-free circuit structure from changing when transmitting signals.

Furthermore, in the present embodiment, both the upper circuit 32 and the bottom circuit 12 are electrically connected to a ground. When the pad supporting structure 11 is formed, the pad supporting structure 11 is electrically neutral, and the pad supporting structure 11 remains electrically neutral by being electrically insulated from the ground. The bottom circuit layer 1 also includes a bottom layer dielectric 10, and the bottom layer dielectric 10 is formed within the bottom gap 13. The circuit layer 2 further includes a transmission channel 21. The transmission channel 21 is formed embedded in the circuit layer dielectric 20, and the transmission channel 21 is electrically connected to the pad 31 of the connection layer 3. The connection layer 3 includes an upper layer dielectric 30, and the upper layer dielectric 30 is formed within the upper gap 33. In other words, in the first embodiment, the collapse-free circuit structure is a solid piece of hardware without having empty spaces therein. The bottom gap 13 and the upper gap 33 are respectively filled with the bottom layer dielectric 10 and the upper layer dielectric 30, eliminating empty spaces within the collapse-free circuit structure.

In an embodiment, the bottom layer dielectric 10 that fills up the bottom gap is a liquid dielectric. However, regardless the bottom layer dielectric 10 being a liquid or a solid, the pad supporting structure 11 that is surrounded by the bottom layer dielectric 10 will provide structural support for the pad 31 by being positioned right under the pad 31, preventing the pad 31 from caving-in. Overall, in another embodiment, even if the bottom gap 13 and the upper gap 33 are hollow, the pad 31 will still be structurally supported by the circuit layer dielectric 20 and the pad supporting structure 11 right below, preventing the pad 31 from collapsing.

In an embodiment, the bottom circuit layer 1 may be mounted on a substrate 100 or a printed circuit board (PCB). For instance, the bottom circuit layer 1 has two surfaces, one of the surfaces is connected to the circuit layer 2, and the other surface facing away from the circuit layer 2 is connected to the substrate 100. In an embodiment, the substrate 100 is a thin film. In another embodiment, the substrate 100 may also be a redistribution layer (RDL).

Figure 2B:
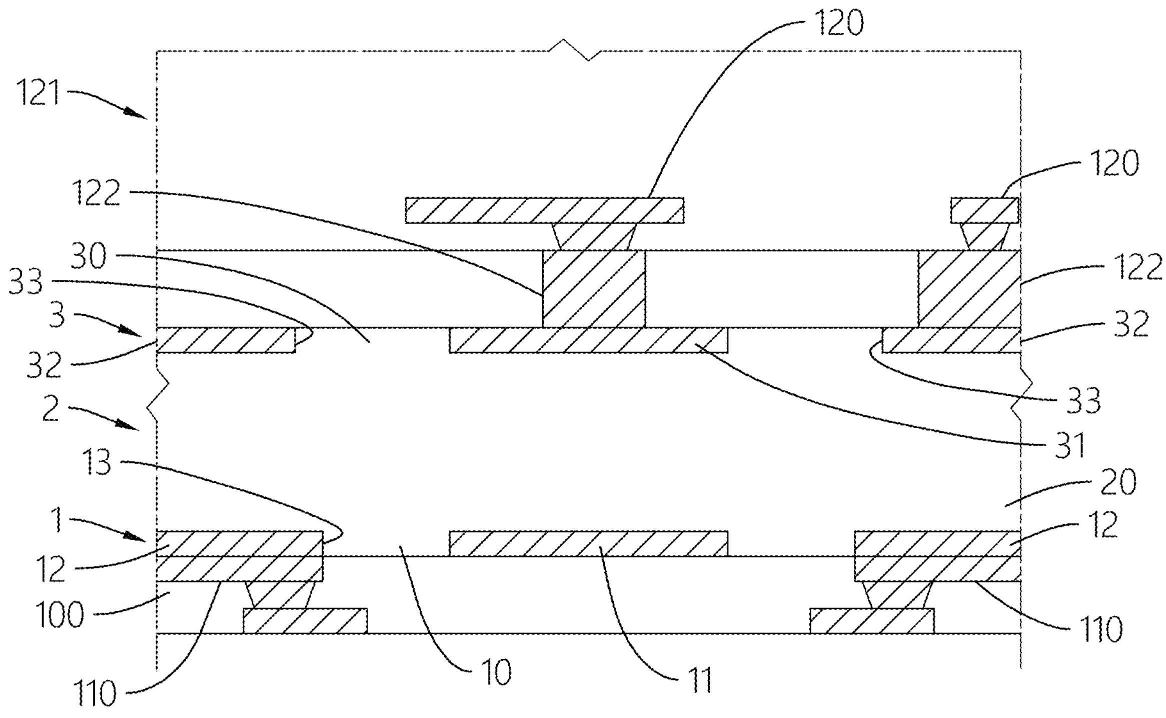
FIG. 2B is a cross-sectional perspective view of an electrical application of the collapse-free circuit structure in the first embodiment of the present invention.

With reference to FIG. 2B, for example, the substrate 100, being the RDL, includes a first external circuit 110. The first external circuit 110 is electrically connected to the bottom circuit 12 of the bottom circuit layer 1, allowing both the bottom circuit 12 and the first external circuit 110 to electrically connect to the ground, i.e. a common ground.

Since the connection layer 3 and the circuit layer 2 remain structurally stable and collapse-free, the present invention also ensures a signal can be stably transmitted and remain stably transmitted through the connection layer 3 and the circuit layer 2. Such a structural stability also ensures that the connection layer 3 is able to be normally soldered to other electrical hardware. For example, the pad of the connection layer 3 is exposed on a surface facing away from the circuit layer 2, and the pad 31 is electrically connected to a second external circuit 120. The second external circuit 120 may consist of various electrical components such as a resistor, an inductor, or a capacitor. For this reason, once the pad 31 of the connection layer 3 is electrically connected to the second external circuit 120, the collapse-free circuit structure of the present invention is able to integrate more circuits for more various electrical applications.

In an embodiment, the second external circuit 120 may be a chip 121, and the chip 121 is electrically connected to the pad 31 via a pin 122 of the chip 121. In another embodiment, the second external circuit 120 may be an optoelectronic component, and the optoelectronic component is electrically connected to the pad 31 via an input/output (I/O) electrode of the optoelectronic component. Overall, the bottom circuit layer 1 and the connection layer 3 that are electrically connected to various circuits enable the collapse-free circuit structure of the present invention to be configured to three dimensional (3D) circuit applications. The present invention thus allows a 3D integrated circuit (IC) to have a more stable and collapse-free circuit structure.

In the present embodiment, the transmission channel 21 is utilized for transmitting a high frequency signal to a load. As the collapse-free circuit structure has constant impedance transmitting the high frequency signal, the collapse-free circuit structure and the load can maintain matched impedances, and thus improving a signal-to-noise ratio (SNR) of the high frequency signal being transmitted. To understand the logic of how the collapse-free circuit structure of the present invention is able to improve a signal quality of the high frequency signal, please refer to paragraphs detailed in the background of the invention.

The applicant of the present invention has computer simulated and verified that the collapse-free circuit structure of the present invention is indeed able to decrease a capacitance of the collapse-free circuit structure by forming the bottom gap 13 in the bottom circuit layer 1, and to keep a status of matched impedance between the collapse-free circuit structure and the load that is electrically connected to the collapse-free circuit structure. The computer simulation simulated an insertion loss and a return loss of having a signal transmitted between 0 and 70 gigahertz (GHz), and further compared changes of the insertion loss and the return loss by with or without having formed the bottom gap 13 of the present invention.

The simulation provides a result that, in comparison to an insertion loss and a return loss simulated without having the bottom gap 13, the insertion loss approaches zero more closely by simulating having formed the bottom gap 13 of the present invention, and the return loss decreases more by simulating having formed the bottom gap 13 of the present invention. This experimental result confirms that the present invention is indeed able to improve the signal quality of a transmitted signal.

Furthermore, in the first embodiment, a connection part 34 is formed at an end of the pad 31 that faces a first direction Dir1, and the connection part 34 is connected to the transmission channel 21 of the circuit layer 2. A first width L1 of the pad 31 decreases along the first direction Dirt. A transmission part 14 is formed at an end of the pad supporting structure 11 that faces the first direction Dirt. A second width L2 of the pad supporting structure 11 decreases along the first direction Dirt. In other words, in the present embodiment, both the transmission part 14 of the pad supporting structure 11 and the connection part 34 of the pad 31 point toward the first direction Dir1, as the first direction Dir1 is a direction that the transmission channel 21 of the circuit layer 2 extends towards. In an embodiment, the pad 31 that has the first width L1 decreases along the first direction Dir1 and the pad supporting structure 11 that has the second width L2 decreases along the first direction Dirt are respectively having a same funnel shape. In another embodiment, the pad 31 that has the first width L1 decreases along the first direction Dirt and the pad supporting structure 11 that has the second width L2 decreases along the first direction Dir1 are having different types of funnel shapes.

Figure 2C:
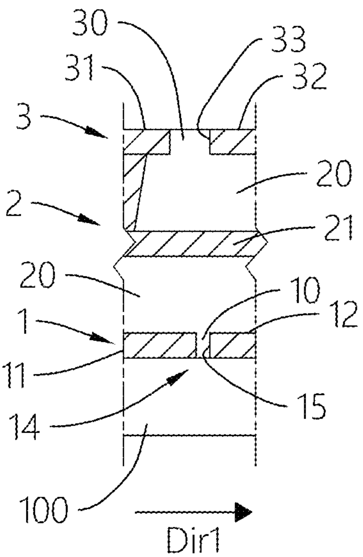
FIG. 2C is another cross-sectional perspective view of the collapse-free circuit structure in the first embodiment of the present invention.

With further reference to FIG. 2C, FIG. 2C shows a part of a cross-sectional perspective view of the collapse-free circuit structure across a line B shown in FIG. 1D. A length of the bottom gap 13 between the pad supporting structure 11 and the bottom circuit 12 changes according to different formational position configurations of the pad supporting structure 11 and the bottom circuit 12 within the bottom circuit layer 1. For the bottom gap 13 between the transmission part 14 of the pad supporting structure 11 and the bottom circuit 12, the bottom gap 13 is a microscopic opening 15 of less than or equal to 10 microns (m) wide. In an embodiment, a shortest gap distance between the transmission part 14 of the pad supporting structure 11 and the bottom circuit 12 is the bottom gap 13. For the first embodiment shown in FIGS. 1A to 1C, the transmission part 14 of the pad supporting structure 11 is located right below the connection part 34 of the pad 31. This way, the connection layer 3 right above the microscopic opening 15 corresponds to the upper gap 33. A gap space of the upper gap 33 is bigger than a gap space of the microscopic opening 15, or in other words, the gap space of the microscopic opening 15 is less than the gap space of the upper gap 33.

Figure 3C:
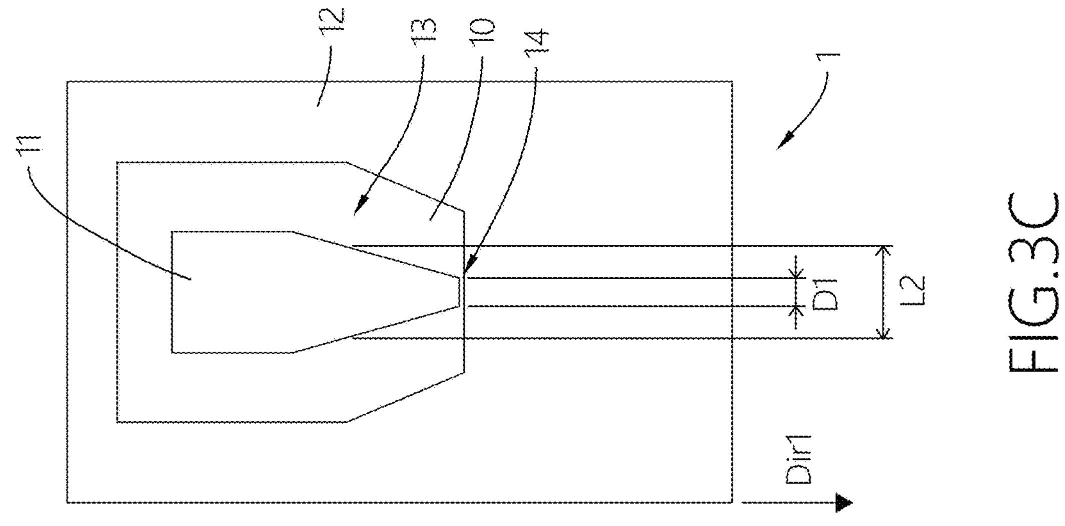
FIG. 3C is a perspective view of the bottom circuit layer of the collapse-free circuit structure in the second embodiment of the present invention.
Figure 3B:
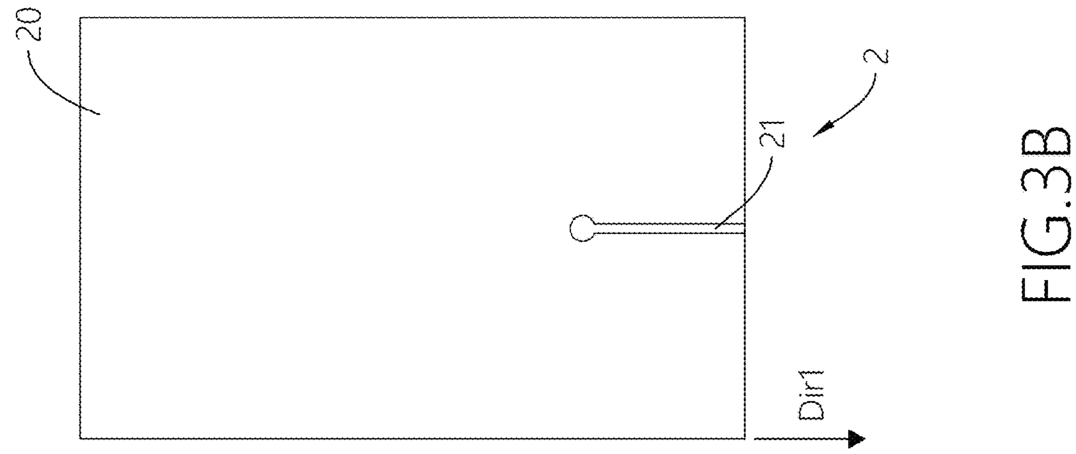
FIG. 3B is a perspective view of the circuit layer of the collapse-free circuit structure in the second embodiment of the present invention.
Figure 3A:
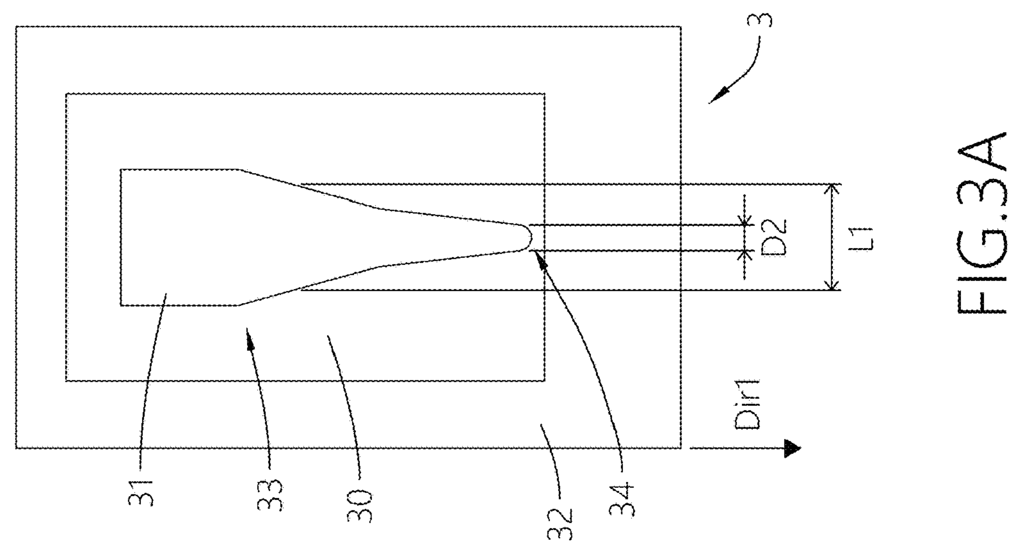
FIG. 3A is a perspective view of the connection layer of the collapse-free circuit structure in a second embodiment of the present invention.

With reference to FIGS. 3A to 3C, in a second embodiment, the connection part 34 of the pad 31 and the transmission part 14 of the pad supporting structure 11 are skewed when the connection layer 3 and the bottom circuit layer 1 are layered together, as the connection part 34 of the pad 31 is located right above the bottom circuit 12. Since the microscopic opening 15 of the bottom circuit layer 1 is less than or equal to 10 m wide, the opening is small enough to structurally support the transmission structures located right above the microscopic opening 15, preventing the transmission structures located right above the microscopic opening 15 from collapsing. In other words, parts of the circuit layer 2 and the connection layer 3 that are located right above the microscopic opening 15 are still well supported by the bottom circuit layer 1 to be collapse-free. Overall, in the second embodiment, despite having the microscopic opening 15 located right below the pad 31, the pad 31 is still structurally well supported enough to be collapse-free.

Figure 3D:
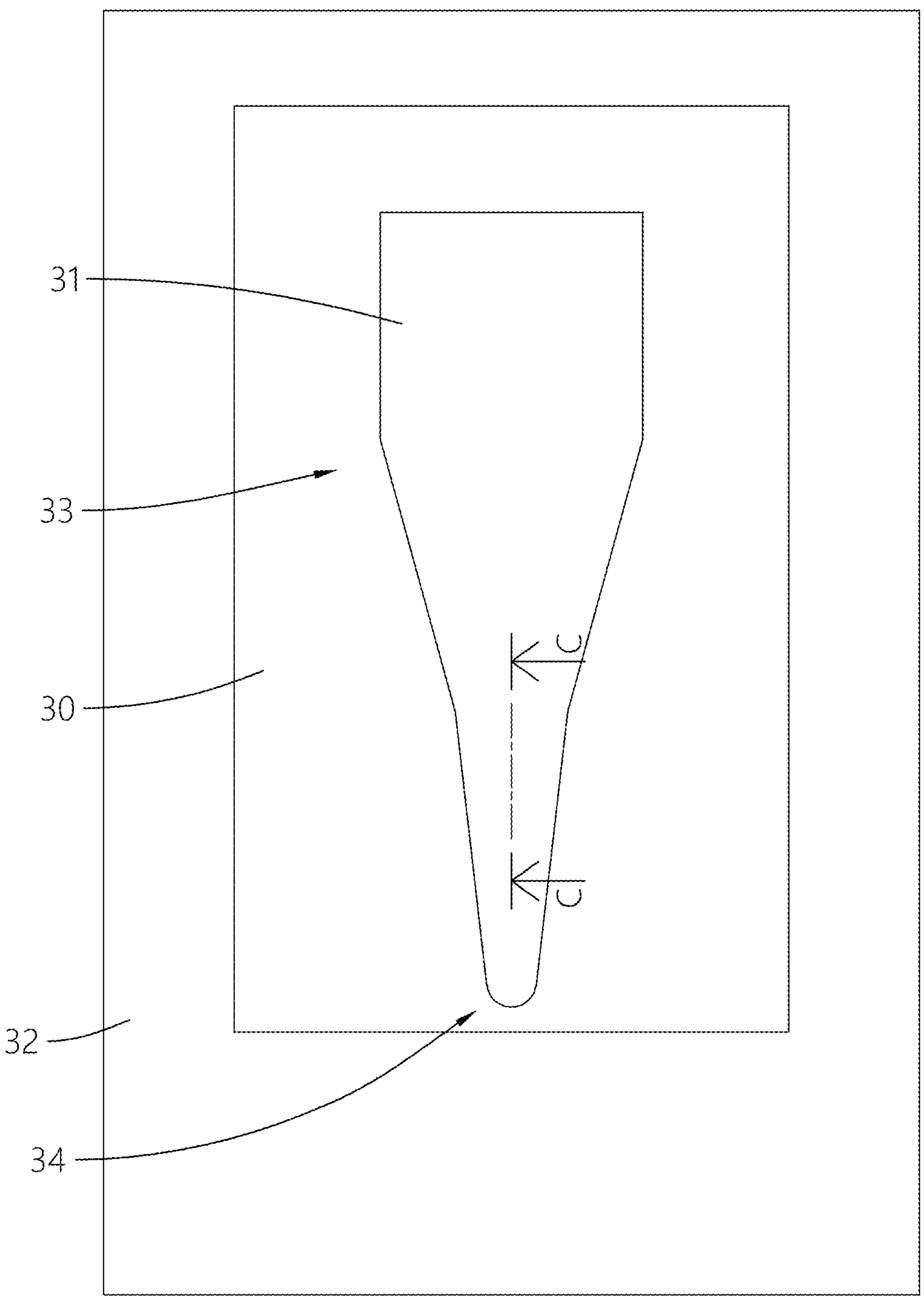
FIG. 3D is a perspective view of the collapse-free circuit structure in the second embodiment of the present invention.
Figure 4:
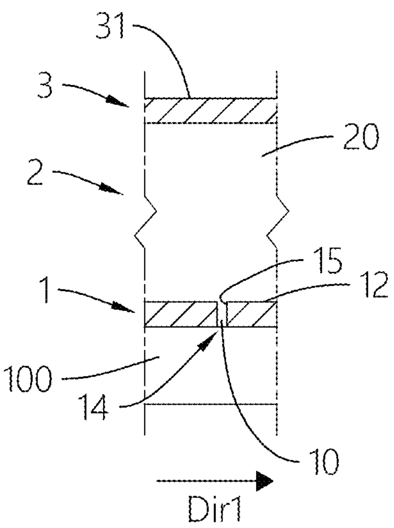
FIG. 4 is a cross-sectional perspective view of the collapse-free circuit structure in the second embodiment of the present invention.

With further reference to FIG. 3D and FIG. 4, FIG. 3D is a perspective view of the collapse-free circuit structure having the bottom circuit layer 1, the circuit layer 2, and the connection layer 3 shown in FIGS. 3A to 3C layered together. FIG. 4 shows a part of a cross-sectional perspective view of the collapse-free circuit structure across a line C shown in FIG. 3D. With reference to FIG. 4, a part of the connection layer 3 located right above the microscopic opening 15 corresponds to the pad 31.

By comparing FIG. 2C and FIG. 4, it is evident that in the first embodiment depicted in FIG. 2C, a part of the circuit layer 2 located right above the microscopic opening 15 corresponds to a part of the transmission channel 21. In other words, the transmission channel 21 passes right above the microscopic opening 15. However, in the second embodiment depicted in FIG. 4, a part of the circuit layer 2 located right above the microscopic opening 15 does not correspond to a part of the transmission channel 21. In other words, the transmission channel 21 does not pass right above the microscopic opening 15. This structural difference between the two embodiments corresponds to different physics properties for transmitting the high frequency signal, and thus the two embodiments structurally satisfy different needs for transmitting the high frequency signal.

Figure 5C:
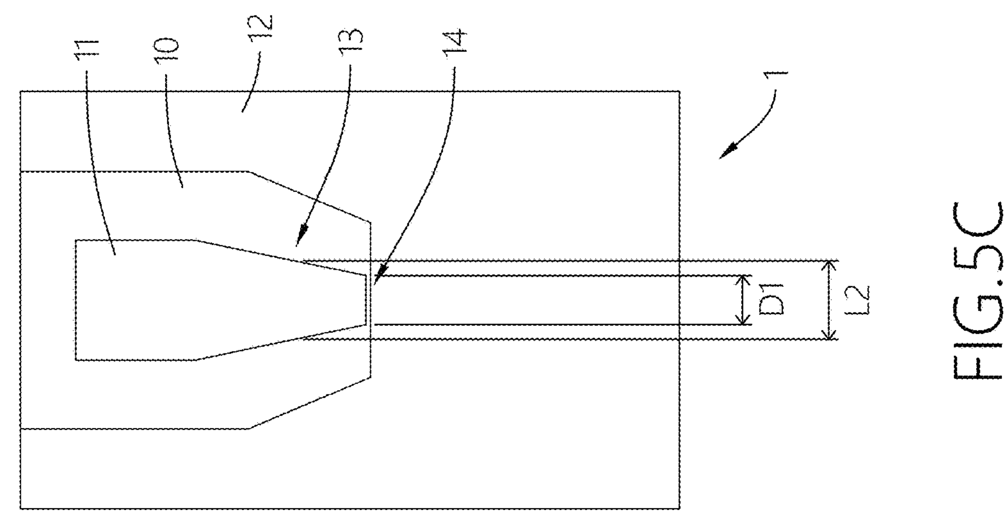
FIG. 5C is a perspective view of the bottom circuit layer of the collapse-free circuit structure in the third embodiment of the present invention.
Figure 5B:
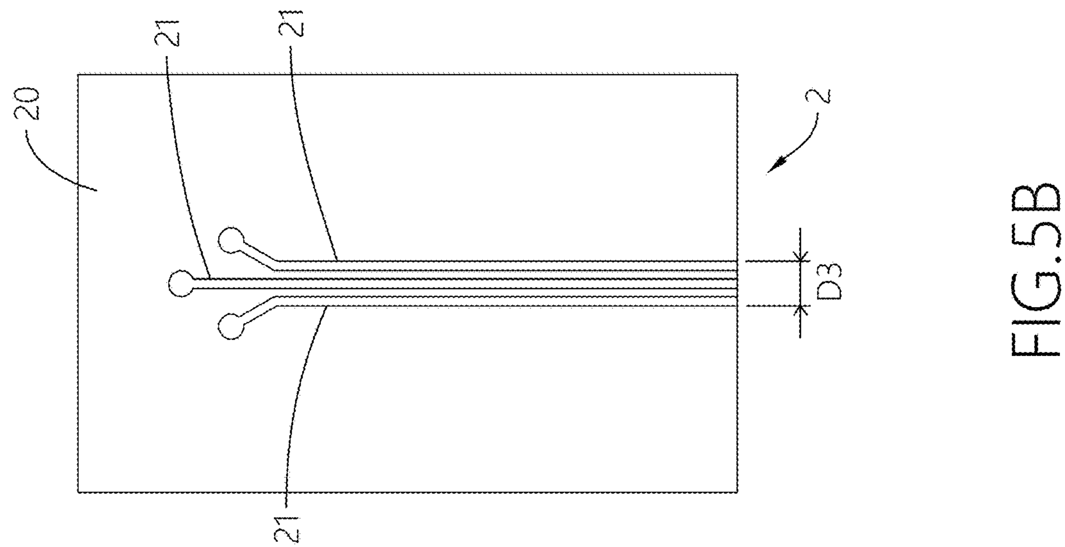
FIG. 5B is a perspective view of the circuit layer of the collapse-free circuit structure in the third embodiment of the present invention.
Figure 5A:
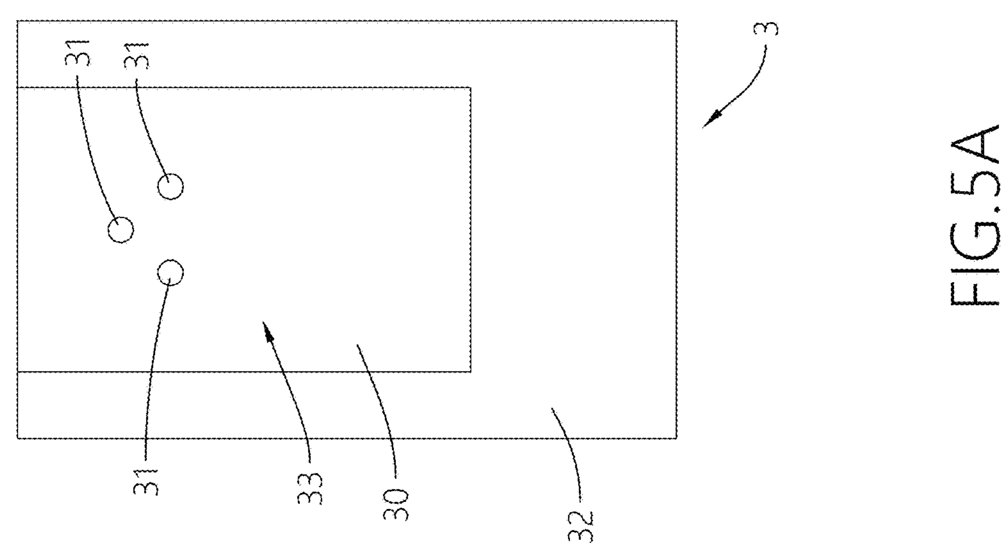
FIG. 5A is a perspective view of the connection layer of the collapse-free circuit structure in a third embodiment of the present invention.
Figure 6A:
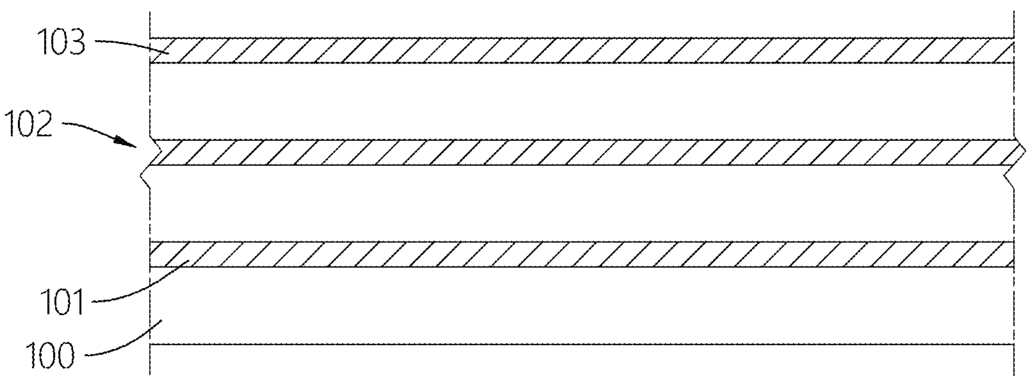
FIG. 6A is a cross-sectional perspective view of an ordinary transmission line structure.
Figure 6B:
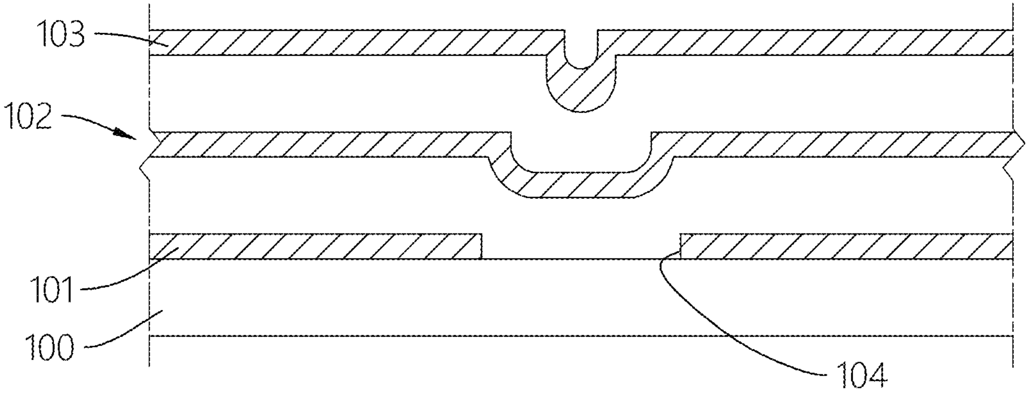
FIG. 6B is a cross-sectional perspective view of a structural collapse of the ordinary transmission line structure.
Figures 7A, 7B, 7C:
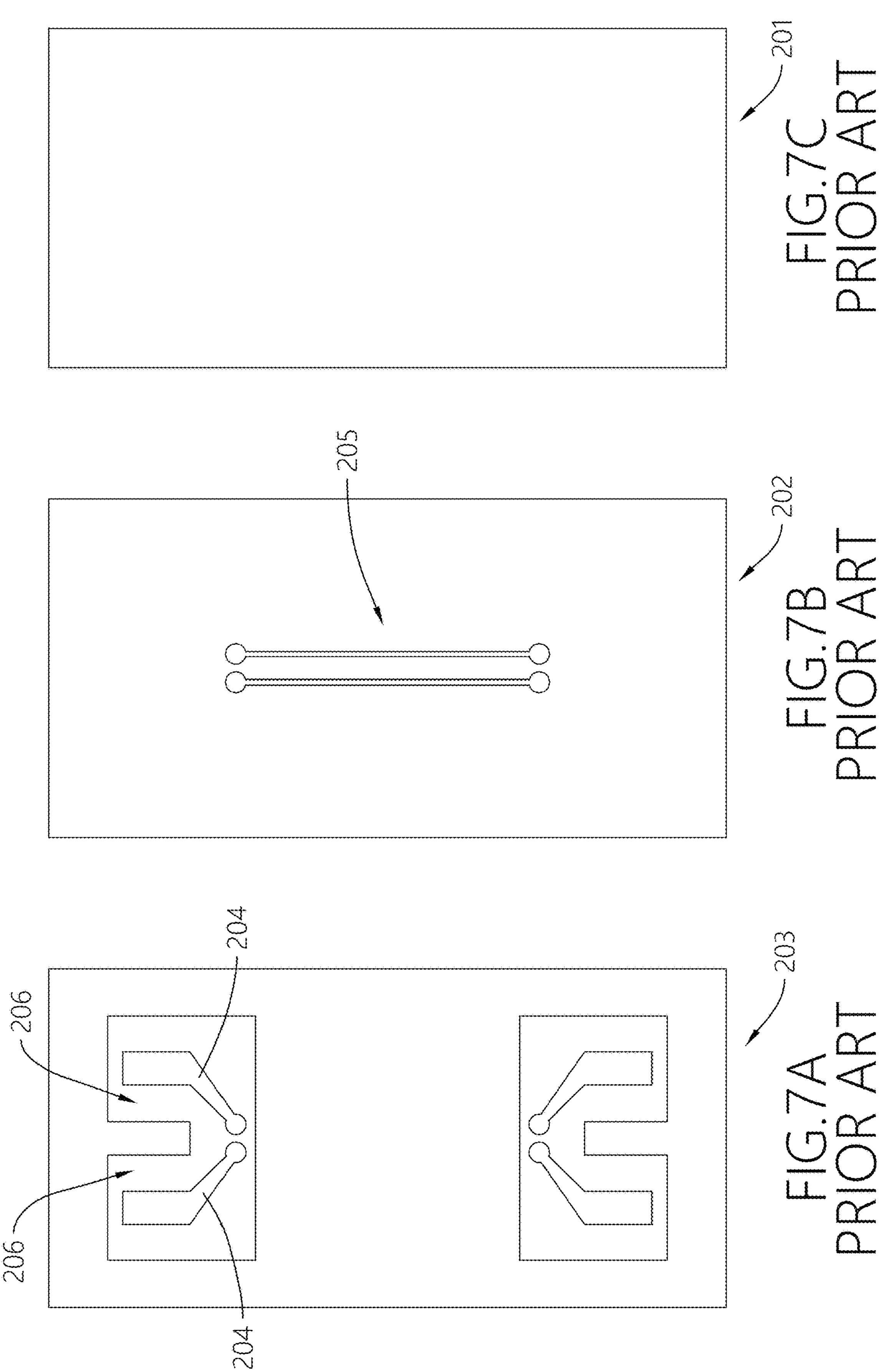
FIG. 7A is a perspective view of an external connection circuit layer of an ordinary transmission line.
FIG. 7B is a perspective view of a middle transmission circuit layer of the ordinary transmission line.
FIG. 7C is a perspective view of a bottom ground circuit layer of the ordinary transmission line.
Figure 7D:
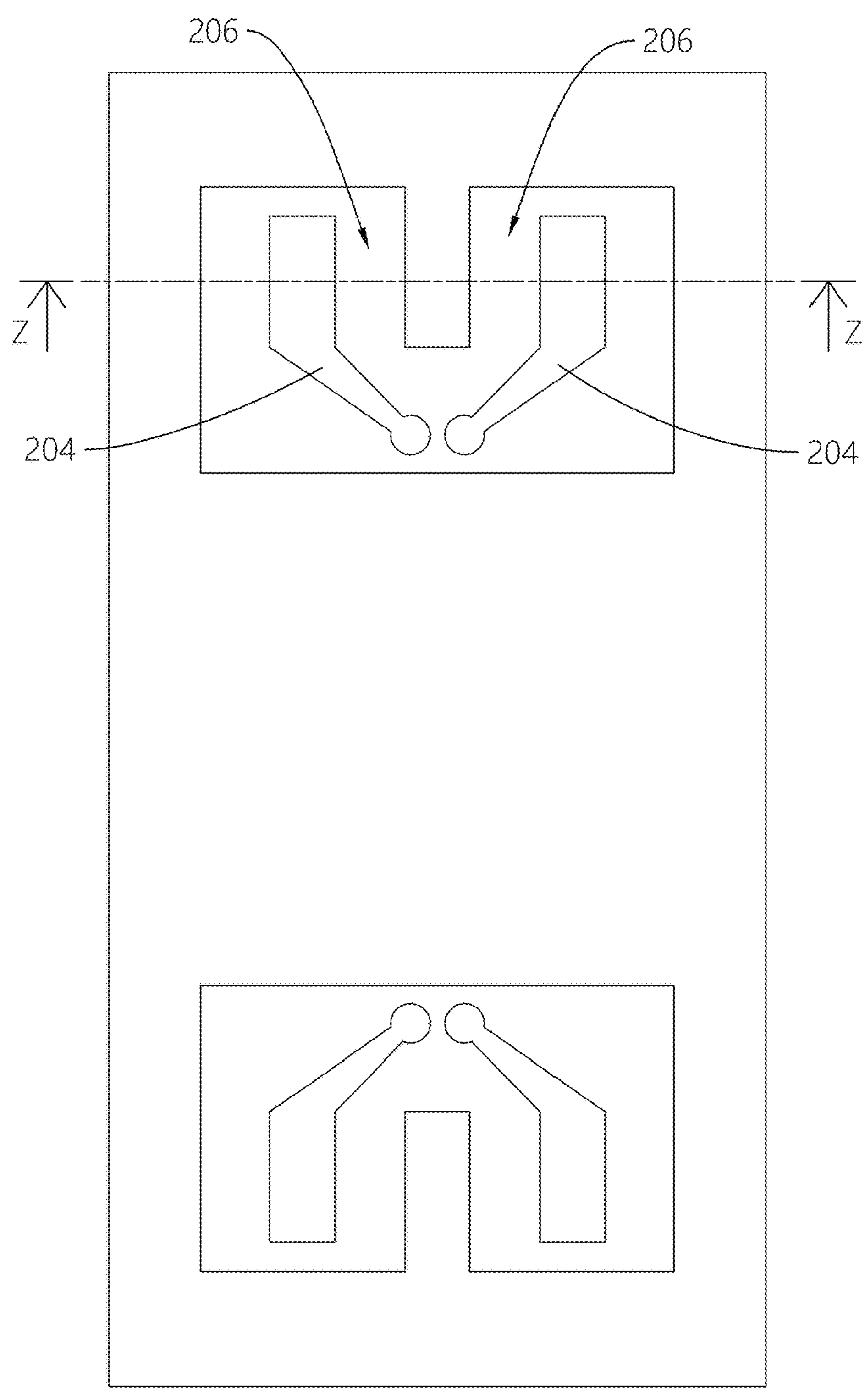
FIG. 7D is a perspective view of the ordinary transmission line.
Figure 8:
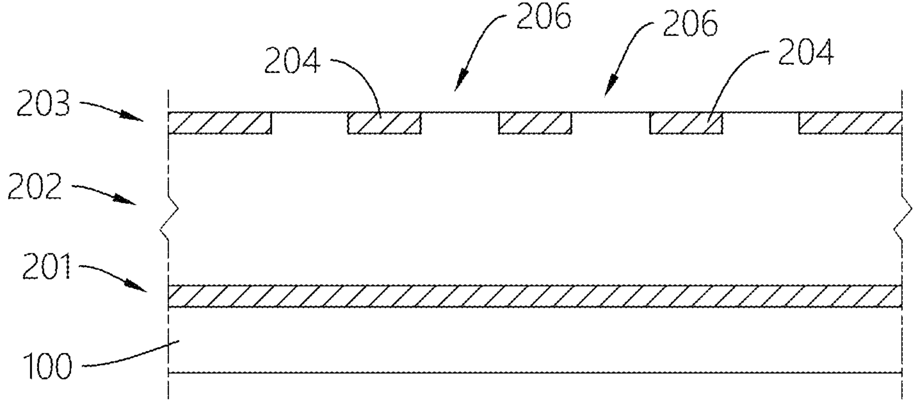
FIG. 8 is a cross-sectional perspective view of the ordinary transmission line.

With reference to FIGS. 5A to 5C, in a third embodiment, the connection layer 3 includes a plurality of the pads 31. Furthermore, the upper layer dielectric 30 is formed between each of the pads 31 for providing electrical insulation between each of the pads 31. The circuit layer 2 further includes a plurality of the transmission channels 21, and each of the transmission channels 21 is electrically connected to a respective one of the pads 31 in the connection layer 3. The circuit layer dielectric 20 is formed between each of the transmission channels 21 for providing electrical insulation between each of the transmission channels 21. This way, the transmission channels 21 and the pads 31 are able to transmit multiple channels of the high frequency signal. For example, two of the transmission channels 21 with two of the pads 31 enable a strip line transmission of a differential signaling pair for the high frequency signal. Three of the transmission channels 21 with three of the pads 31 enable further various applications for transmitting the high frequency signal.

With reference to FIG. 3A and FIG. 3C, in the second embodiment, the pad supporting structure 11 has a first funnel shape, and the first funnel shape has a first diameter D1 as a shortest diameter of the first funnel shape. The pad 31 has a second funnel shape, and the second funnel shape has a second diameter D2 as a shortest diameter of the second funnel shape. As the first diameter D1 is greater than the second diameter D2, the pad supporting structure 11 is ensured to support the connection part 34 of the pad 31. In another embodiment, the first diameter D1 is equal to the second diameter D2, ensuring that the pad supporting structure 11 is still able to support the connection part 34 of the pad 31.

With reference to FIG. 5B and FIG. 5C, in the second embodiment, the pad supporting structure 11 has a first funnel shape, and the first funnel shape has a first diameter D1 as a shortest diameter of the first funnel shape. The transmission channels 21 of the circuit layer 2 that extend along the first direction Dir1 have a cluster diameter D3 for the cluster of the transmission channels 21, and the first diameter D1 is greater than or equal to the cluster diameter D3. In other words, the cluster diameter D3 is a width of the cluster of the transmission channels 21 that extend along the first direction Dirt. The second width L2 of the pad supporting structure 11 that decreases along the first direction Dir1 is greater than or equal to the width of the cluster of the transmission channels 21. This ensures that the pad supporting structure 11 is able to structurally support the transmission channels 21 of the circuit layer 2 that extend along the first direction Dir1.

What is claimed is:

1. A collapse-free circuit structure with low capacitance effect, comprising:
- a connection layer, having a pad and an upper circuit; wherein the upper circuit surrounds the pad; wherein the pad and the upper circuit of the connection layer are spaced with an upper gap for electrical insulation;
- a bottom circuit layer, having a bottom circuit and a pad supporting structure, wherein the pad supporting structure is located right below the pad, and the bottom circuit surrounds the pad supporting structure; wherein the pad supporting structure and the bottom circuit are spaced with a bottom gap for electrical insulation;
- a circuit layer, having a circuit layer dielectric; wherein the circuit layer is layered between the bottom circuit layer and the connection layer; wherein the circuit layer dielectric is located between the pad and the pad supporting structure to electrically insulate the pad supporting structure and the pad.

2. The collapse-free circuit structure as claimed in claim 1, wherein the connection layer further comprises:
- an upper layer dielectric, formed within the upper gap.

3. The collapse-free circuit structure as claimed in claim 1, wherein the bottom circuit layer further comprises:
- a bottom layer dielectric, formed within the bottom gap.

4. The collapse-free circuit structure as claimed in claim 3, wherein the bottom layer dielectric is a liquid dielectric.

5. The collapse-free circuit structure as claimed in claim 1, wherein the circuit layer further comprises:
- a transmission channel, embedded in the circuit layer dielectric, and electrically connected to the pad of the connection layer.

6. The collapse-free circuit structure as claimed in claim 5, wherein a connection part is formed at an end of the pad that faces a first direction, and the connection part of the pad is electrically connected to the transmission channel;
- wherein a first width of the pad decreases along the first direction.

7. The collapse-free circuit structure as claimed in claim 6, wherein a transmission part is formed at an end of the pad supporting structure that faces the first direction;
- wherein a second width of the pad supporting structure decreases along the first direction;
- wherein a microscopic opening of less than or equal to 10 microns (μm) wide is formed between the transmission part of the pad supporting structure and the bottom circuit.

8. The collapse-free circuit structure as claimed in claim 7, wherein the connection part of the pad and the transmission part of the pad supporting structure are skewed when the connection layer and the bottom circuit layer are layered together, as the connection part of the pad is located right above the bottom circuit.

9. The collapse-free circuit structure as claimed in claim 7, wherein the transmission part of the pad supporting structure is located right below the connection part of the pad.

10. The collapse-free circuit structure as claimed in claim 2, wherein the connection layer comprises a plurality of the pads, and the upper layer dielectric is formed between each of the pads for providing electrical insulation between each of the pads;
- wherein the circuit layer further comprises a plurality of the transmission channels, and each of the transmission channels is electrically connected to a respective one of the pads;

wherein the circuit layer dielectric is formed between each of the transmission channels for providing electrical insulation between each of the transmission channels.

11. The collapse-free circuit structure as claimed in claim 10, wherein a transmission part is formed at an end of the pad supporting structure that faces a first direction;

wherein a second width of the pad supporting structure decreases along the first direction;

wherein the transmission channels extend toward the first direction as a cluster with a width, and the second width of the pad supporting structure is greater than or equal to the width of the cluster.

12. The collapse-free circuit structure as claimed in claim 1, wherein a surface of the bottom circuit layer facing away from the circuit layer is configured to connect to a substrate, and the bottom circuit of the bottom circuit layer is electrically connected to a first external circuit of the substrate;

wherein a surface of the connection layer facing away from the circuit layer is configured to connect to a second external circuit, and the pad is electrically connected to the second external circuit.

* * * * *